(12) United States Patent
Luo et al.

(10) Patent No.: US 10,567,085 B2
(45) Date of Patent: Feb. 18, 2020

(54) WAVELENGTH TUNABLE OPTICAL TRANSMITTER APPARATUS

(71) Applicant: HUAWEI TECHNOLOGIES CO., LTD., Shenzhen (CN)

(72) Inventors: Jun Luo, Shenzhen (CN); Zhiyong Feng, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 11 days.

(21) Appl. No.: 16/047,013

(22) Filed: Jul. 27, 2018

(65) Prior Publication Data

US 2018/0375584 A1 Dec. 27, 2018

Related U.S. Application Data

(63) Continuation of application No. PCT/CN2016/072585, filed on Jan. 28, 2016.

(51) Int. Cl.
*H04B 10/50* (2013.01)
*H01S 5/065* (2006.01)
(Continued)

(52) U.S. Cl.
CPC ......... *H04B 10/506* (2013.01); *H01S 5/0657* (2013.01); *H01S 5/4025* (2013.01); *H04J 14/0227* (2013.01); *H04B 10/50* (2013.01)

(58) Field of Classification Search
CPC ..... H04B 10/506; H04B 10/50; H01S 5/0657; H01S 5/4025; H01S 5/0268;
(Continued)

(56) References Cited

U.S. PATENT DOCUMENTS 5,576,881 A * 11/1996 Doerr ................. H04B 10/2507
359/333
6,034,799 A * 3/2000 Hansen ................ H04B 10/506
385/24
(Continued)

FOREIGN PATENT DOCUMENTS

CN 101827288 A 9/2010
CN 102082610 A 6/2011
(Continued)

*Primary Examiner* — Dibson J Sanchez
(74) *Attorney, Agent, or Firm* — Kilpatrick Townsend & Stockton LLP (57) ABSTRACT

A wavelength tunable optical transmitter apparatus relates to the field of communications technologies and includes a plurality of multi-longitudinal mode lasers (1), a cyclic wavelength demultiplexer/multiplexer (2), and a reflector (3). The multi-longitudinal mode lasers output multi-longitudinal mode signals having a periodically repeated frequency interval, where the period is Δfmode. The cyclic wavelength demultiplexer/multiplexer performs periodically repeated filtering on the multi-longitudinal mode signals input by the multi-longitudinal mode lasers, to obtain single frequency signals, where a repetition period of a filter window is Δfband, Δfmode is different from Δfband, and Δfmode and Δfband are not in an integer-multiple relationship, and then, multiplexes the plurality of single frequency signals and outputs the multiplexed signal. The reflector reflects the multiplexed signal. The reflected multiplexed signal separately returns to the multi-longitudinal mode laser by using the cyclic wavelength demultiplexer/multiplexer again.

11 Claims, 6 Drawing Sheets

(51) Int. Cl.
*H01S 5/40* (2006.01)
*H04J 14/02* (2006.01)

(58) Field of Classification Search
CPC ...... H01S 5/0656; H01S 5/4087; H01S 5/065; H04J 14/0227; H04J 14/0256
USPC .................................. 398/43–103, 182–201
See application file for complete search history.

(56) References Cited

U.S. PATENT DOCUMENTS

| | | | | |
|---|---|---|---|---|
| 6,052,394 | A * | 4/2000 | Lee ................... | H01S 3/094003 372/102 |
| 6,055,250 | A * | 4/2000 | Doerr ................ | H01S 5/026 372/23 |
| 6,373,604 | B1 * | 4/2002 | Xie ................... | G02B 6/272 398/79 |
| 6,459,829 | B1 * | 10/2002 | Yamauchi .......... | G02B 6/12011 385/11 |
| 6,498,871 | B1 * | 12/2002 | Kuboki .............. | H04B 10/506 385/24 |
| 6,567,580 | B2 * | 5/2003 | Bacher .............. | G02B 6/12004 385/24 |
| 7,031,354 | B2 * | 4/2006 | Cheng ............... | H01S 5/141 372/29.02 |
| 7,265,896 | B2 * | 9/2007 | Miller ............... | G02F 1/3501 359/326 |
| 7,596,315 | B2 * | 9/2009 | Nakashima ........ | H04B 10/07 398/34 |
| 8,073,341 | B2 * | 12/2011 | Byun ................ | H04B 10/0799 398/182 |
| 8,463,088 | B1 * | 6/2013 | Asghari ............. | B82Y 20/00 359/333 |
| 8,472,805 | B2 | 6/2013 | Lam et al. | |
| 8,606,107 | B2 | 12/2013 | Bai et al. | |
| 9,083,469 | B2 * | 7/2015 | Lee ................... | H04B 10/572 |
| 9,118,165 | B1 | 8/2015 | Norberg ............ | H01S 3/08086 |
| 9,379,838 | B2 * | 6/2016 | Nagarajan .......... | H04J 14/02 |
| 9,444,218 | B1 * | 9/2016 | Huang ............... | H01S 5/06821 |
| 9,602,216 | B2 * | 3/2017 | Chanclou ........... | H04B 10/2587 |
| 2002/0021464 | A1 * | 2/2002 | Way .................. | H04B 10/50 398/79 |
| 2004/0067059 | A1 * | 4/2004 | Song ................. | H04B 10/2503 398/82 |
| 2004/0179843 | A1 * | 9/2004 | Jung ................. | H04J 14/02 398/79 |
| 2005/0036527 | A1 * | 2/2005 | Khazaei ............. | H01S 3/067 372/29.02 |
| 2005/0135449 | A1 * | 6/2005 | Sorin ................ | H04B 10/506 372/50.1 |
| 2005/0175046 | A1 * | 8/2005 | Khazaei ............. | H01S 5/0687 372/29.02 |
| 2006/0083515 | A1 * | 4/2006 | Hann ................ | H04J 14/02 398/87 |
| 2006/0251422 | A1 * | 11/2006 | Liu ................... | G02B 6/4215 398/79 |
| 2006/0256831 | A1 * | 11/2006 | Volodin ............. | G02B 27/0944 372/102 |
| 2008/0279557 | A1 * | 11/2008 | Park ................. | H04B 10/572 398/79 |
| 2010/0316378 | A1 * | 12/2010 | Yeh .................. | H01S 5/4062 398/58 |
| 2010/0316383 | A1 * | 12/2010 | Kim .................. | H04J 14/0282 398/79 |
| 2011/0038635 | A1 * | 2/2011 | Bai ................... | H01S 5/0656 398/82 |
| 2011/0064411 | A1 * | 3/2011 | Eiselt ................ | H04B 10/272 398/82 |
| 2011/0110665 | A1 * | 5/2011 | Rhy .................. | B82Y 20/00 398/79 |
| 2011/0129227 | A1 | 6/2011 | Wen et al. | |
| 2011/0216789 | A1 * | 9/2011 | Docter ............... | H01S 5/06256 372/20 |
| 2011/0292953 | A1 * | 12/2011 | Liu ................... | H01S 5/06256 372/20 |
| 2012/0020616 | A1 * | 1/2012 | Babie ................ | G02B 6/2817 385/27 |
| 2012/0093515 | A1 * | 4/2012 | Lin ................... | H04B 10/506 398/79 |
| 2012/0141128 | A1 | 6/2012 | Bai et al. | |
| 2012/0195593 | A1 * | 8/2012 | Bernasconi ........ | H04B 10/506 398/48 |
| 2012/0269516 | A1 | 10/2012 | Liu et al. | |
| 2013/0016977 | A1 * | 1/2013 | Zheng ............... | H01S 5/0268 398/87 |
| 2013/0170787 | A1 * | 7/2013 | Nagarajan .......... | H04B 10/506 385/14 |
| 2013/0209094 | A1 * | 8/2013 | Jeong ................ | H04J 14/0221 398/34 |
| 2014/0029083 | A1 * | 1/2014 | Komljenovic ...... | H01S 5/041 359/341.3 |
| 2014/0029945 | A1 * | 1/2014 | Martinelli .......... | H01S 5/146 398/58 |
| 2014/0064727 | A1 * | 3/2014 | Presi ................. | H04B 10/2572 398/49 |
| 2014/0064733 | A1 * | 3/2014 | Liu ................... | H04B 10/506 398/79 |
| 2014/0161144 | A1 * | 6/2014 | Xu .................... | H01S 5/141 372/6 |
| 2014/0205293 | A1 * | 7/2014 | Lin ................... | H01S 5/141 398/58 |
| 2015/0010305 | A1 | 1/2015 | Effenberger et al. | |
| 2015/0023672 | A1 | 1/2015 | Dai | |
| 2015/0063803 | A1 * | 3/2015 | Ciaramella ........ | H04J 14/0246 398/49 |
| 2015/0071641 | A1 * | 3/2015 | Wen .................. | H04B 10/5165 398/98 |
| 2015/0236788 | A1 * | 8/2015 | Chanclou ........... | H04B 10/502 398/65 |
| 2015/0236809 | A1 * | 8/2015 | Dong ................ | H04J 14/02 398/79 |
| 2015/0311669 | A1 * | 10/2015 | Chuang ............. | H01S 5/0064 398/65 |
| 2015/0341136 | A1 * | 11/2015 | Chanclou ........... | H04B 10/272 398/67 |
| 2015/0381279 | A1 * | 12/2015 | Tanemura .......... | H04J 14/02 398/65 |
| 2016/0105251 | A1 * | 4/2016 | Cheng ............... | H04B 10/25759 398/68 |
| 2016/0119063 | A1 * | 4/2016 | Guo .................. | H04B 10/572 398/79 |
| 2016/0315451 | A1 * | 10/2016 | de Valicourt ....... | H01S 5/1007 |
| 2017/0005728 | A1 * | 1/2017 | Wang ................ | H04B 10/272 |
| 2017/0026116 | A1 * | 1/2017 | Sprem ............... | H04B 10/506 |
| 2017/0063022 | A1 * | 3/2017 | Komljenovic ...... | H01S 3/10092 |
| 2017/0237518 | A1 * | 8/2017 | Yang ................. | H04B 10/07 398/79 |
| 2018/0172907 | A1 | 6/2018 | Fu et al. | |
| 2018/0191132 | A1 | 7/2018 | Hu et al. | |

FOREIGN PATENT DOCUMENTS

| | | |
|---|---|---|
| CN | 102208737 A | 10/2011 |
| CN | 102388547 A | 3/2012 |
| CN | 102611505 A | 7/2012 |
| CN | 103311802 A | 9/2013 |
| CN | 104538841 A | 4/2015 |
| CN | 104966989 A | 10/2015 |
| EP | 1422794 A2 | 5/2004 |
| EP | 1851572 A1 | 1/2008 |
| JP | 2003174414 A | 6/2003 |

* cited by examiner

WAVELENGTH TUNABLE OPTICAL TRANSMITTER APPARATUS

CROSS-REFERENCE TO RELATED APPLICATIONS

This application is a continuation of International Application No. PCT/CN2016/072585, filed on Jan. 28, 2016, the disclosure of which is hereby incorporated by reference in its entirety.

TECHNICAL FIELD

The present invention relates to the field of communications technologies, and in particular, to a wavelength tunable optical transmitter apparatus.

BACKGROUND

To improve a network transmission capacity, a demand of introducing a wavelength division multiplexing (WDM) technology to metropolitan-area access and a data center is increasingly urgent. By means of the WDM technology, a transmission capability of a single optical fiber can be exponentially increased, and a wavelength dimension is introduced to network management and planning. In a WDM network, a distributed feedback laser (DFB) is usually used to transmit a wavelength signal. However, various signals of different wavelengths are needed in the WDM network, and each type of DFB laser transmits signals of a fixed wavelength. Therefore, the WDM network needs to include optical transceiver modules of DFB lasers that transmit signals of different wavelengths. Consequently, types of optical transceiver modules are increased, resulting in increased costs during good preparation, installation, operation and maintenance. In the prior art, a wavelength tunable laser is used to replace a fixed-wavelength DFB laser. A principle of the wavelength tunable laser is tuning a wavelength based on a Vernier effect of two groups of comb filters. A main implementation solution of the comb filter is etching a Distributed Bragg Reflector (DBR) on a semiconductor laser. By means of a wavelength tunable laser, not only types of optical modules can be reduced, but also additional flexibility is brought to network management and planning.

The prior art has at least the following problems: because a fine manufacturing process is required in manufacturing of the DBR grating, manufacturing costs of a DBR tunable laser are higher than costs of a common DFB laser. In addition, to tune a wavelength, a wavelength tunable laser needs complex multi-electrode current control and a control algorithm. This increases a manufacturing complexity rate, and further increases costs of the DBR tunable laser. Therefore, costs of a wavelength tunable laser-based WDM system cannot be radically reduced.

SUMMARY

Embodiments of the present invention provide a wavelength tunable optical transmitter apparatus, to resolve a problem of excessively high manufacturing costs of a wavelength tunable laser-based WDM system.

To achieve the foregoing objective, the following technical solutions are used in the embodiments of the present invention:

According to a first aspect, an embodiment of the present invention provides a wavelength tunable optical transmitter apparatus, including a plurality of multi-longitudinal mode lasers, a cyclic wavelength demultiplexer/multiplexer, and a reflector, where an output end of the multi-longitudinal mode laser is connected to one input end of the cyclic wavelength demultiplexer/multiplexer, an output end of the cyclic wavelength demultiplexer/multiplexer is connected to an input end of the reflector, and an output end of the reflector outputs a multiplexed signal;

the multi-longitudinal mode lasers output multi-longitudinal mode signals having a periodically repeated frequency interval, where the period is $\Delta f mode$;

the cyclic wavelength demultiplexer/multiplexer performs periodically repeated filtering on the input multi-longitudinal mode signals by using filter windows of input ends, to obtain single frequency signals corresponding to the filter windows of the input ends of the cyclic wavelength demultiplexer/multiplexer; and the cyclic wavelength demultiplexer/multiplexer multiplexes the filtered single frequency signals from the input ends and outputs multiplexed signal to the reflector by using the output end of the cyclic wavelength demultiplexer/multiplexer, where a repetition period of the filter window is $\Delta f band$, $\Delta f mode$ is different from $\Delta f band$, and $\Delta f mode$ and $\Delta f band$ are not in an integer-multiple relationship;

the reflector reflects a multiplexed signal of a preset portion of power in the input multiplexed signal back to the cyclic wavelength demultiplexer/multiplexer, and outputs a remaining signal other than the preset portion of power in the input multiplexed signal from the output end of the reflector; after receiving the multiplexed signal reflected by the reflector, the cyclic wavelength demultiplexer/multiplexer demultiplexes the multiplexed signal reflected by the reflector to single frequency signals, and separately determines filter windows of target input ends that correspond to the demultiplexed single frequency signals and the target input ends of the cyclic wavelength demultiplexer/multiplexer that correspond to the filter windows of the target input ends; and feeds back, by using the target input ends, the demultiplexed single frequency signals to the multi-longitudinal mode lasers connected to the target input ends; and the multi-longitudinal mode lasers lock on wavelengths of the single frequency signals fed back by the cyclic wavelength demultiplexer/multiplexer, and generate and output signals whose wavelengths are the same as the wavelengths of the single frequency signals fed back by the cyclic wavelength demultiplexer/multiplexer.

With reference to the first aspect, in a first implementation of the first aspect, the output end of the multi-longitudinal mode laser is connected to a 45-degree Faraday rotator, and an output end of the Faraday rotator is connected to the input end of the cyclic wavelength demultiplexer/multiplexer.

With reference to the first aspect or the first implementation of the first aspect, in a second implementation of the first aspect, the reflector is a transflective 90-degree Faraday rotation mirror.

With reference to the first aspect or the first implementation of the first aspect, in a third implementation of the first aspect, the reflector includes an optical splitter and a total reflection 90-degree Faraday rotation mirror, the optical splitter splits the multiplexed signal output by the cyclic wavelength demultiplexer/multiplexer into two parts, one part is connected to an input end of the total reflection 90-degree Faraday rotation mirror, and the other part of the multiplexed signal is output.

With reference to the third implementation of the first aspect, in a fourth implementation of the first aspect, an Etalon is disposed between the optical splitter and the total reflection 90-degree Faraday rotation mirror.

With reference to the first aspect or any one of the first to the third implementations of the first aspect, in a fifth implementation of the first aspect, the cyclic wavelength demultiplexer/multiplexer includes a cyclic arrayed waveguide grating and an etalon Etalon, an input end of the cyclic arrayed waveguide grating is connected to the output end of the Faraday rotator, an output end of the cyclic arrayed waveguide grating is connected to an input end of the etalon, and an output end of the etalon is connected to the input end of the reflector.

With reference to the first aspect or any one of the first to the third implementations of the first aspect, in a sixth implementation of the first aspect, the cyclic wavelength demultiplexer/multiplexer includes N microring resonant cavities that are connected in series, each of the microring resonant cavities corresponds to one input end of the cyclic wavelength demultiplexer/multiplexer, output ends of the N microring resonant cavities are connected in series, to form the output end of the cyclic wavelength demultiplexer/multiplexer, each of the microring resonant cavities includes a filter window whose repetition period is Δfband, and there is an interval Δfch between filter windows of two neighboring microring resonant cavities, where Δfband=N*Δfch, and N is equal to a quantity of the input ends of the cyclic wavelength demultiplexer/multiplexer.

According to a second aspect, an embodiment of the present invention provides a wavelength tunable optical transmitter apparatus, including a plurality of multi-longitudinal mode lasers, an optical splitter disposed on an output end of each of the multi-longitudinal mode lasers, the cyclic wavelength demultiplexer/multiplexer, and a reflector, where the optical splitter splits a signal output by the multi-longitudinal mode laser into two parts, one part is connected to one input end of the cyclic wavelength demultiplexer/multiplexer, the other part of the signal output by the multi-longitudinal mode laser is output, and an output end of the cyclic wavelength demultiplexer/multiplexer is connected to an input end of the reflector;

the multi-longitudinal mode lasers output multi-longitudinal mode signals having a periodically repeated frequency interval, where the period is Δfmode;

the cyclic wavelength demultiplexer/multiplexer performs periodically repeated filtering on the input multi-longitudinal mode signals by using filter windows of input ends, to obtain single frequency signals corresponding to the filter windows of the input ends of the cyclic wavelength demultiplexer/multiplexer; and the cyclic wavelength demultiplexer/multiplexer multiplexes the filtered single frequency signals from the input ends and outputs multiplexed signal to the reflector by using the output end of the cyclic wavelength demultiplexer/multiplexer, where a repetition period of a center wavelength of the filter window is Δfband, Δfmode is different from Δfband, and Δfmode and Δfband are not in an integer-multiple relationship;

the reflector reflects the input multiplexed signal back to the cyclic wavelength demultiplexer/multiplexer;

after receiving the multiplexed signal reflected by the reflector, the cyclic wavelength demultiplexer/multiplexer demultiplexes the multiplexed signal reflected by the reflector to single frequency signals, separately determines filter windows of target input ends that correspond to the demultiplexed single frequency signals and the target input ends of the cyclic wavelength demultiplexer/multiplexer that correspond to the filter windows of the target input ends, and feeds back, by using the target input ends, the demultiplexed single frequency signals to the multi-longitudinal mode lasers connected to the target input ends; and the multi-longitudinal mode lasers lock on wavelengths of the single frequency signals fed back by the cyclic wavelength demultiplexer/multiplexer, and generate and output signals whose wavelengths are the same as the wavelengths of the single frequency signals fed back by the cyclic wavelength demultiplexer/multiplexer.

With reference to the second aspect, in a first implementation of the second aspect, a 45-degree Faraday rotator is disposed between the multi-longitudinal mode laser and the optical splitter, and the reflector is a transflective 90-degree Faraday rotation mirror.

With reference to the second aspect or the first implementation of the second aspect, in a second implementation of the second aspect, the cyclic wavelength demultiplexer/multiplexer includes a cyclic arrayed waveguide grating and an etalon Etalon, an input end of the cyclic arrayed waveguide grating is connected to an output end of the Faraday rotator, an output end of the cyclic arrayed waveguide grating is connected to an input end of the etalon, and an output end of the etalon is connected to the input end of the reflector.

With reference to the second aspect or the first implementation of the second aspect, in a third implementation of the second aspect, the cyclic wavelength demultiplexer/multiplexer includes N microring resonant cavities that are connected in series, each of the microring resonant cavities corresponds to one input end of the cyclic wavelength demultiplexer/multiplexer, output ends of the N microring resonant cavities are connected in series, to form the output end of the cyclic wavelength demultiplexer/multiplexer, each of the microring resonant cavities includes a filter window whose repetition period is Δfband, and there is an interval Δfch between filter windows of two neighboring microring resonant cavities, where Δfband=N*Δfch, and N is equal to a quantity of the input ends of the cyclic wavelength demultiplexer/multiplexer.

According to a third aspect, an embodiment of the present invention provides a wavelength tunable method, applied to an optical transmitter apparatus. The optical transmitter apparatus includes a plurality of multi-longitudinal mode lasers, a cyclic wavelength demultiplexer/multiplexer, and a reflector, an output end of each of the multi-longitudinal mode lasers is connected to one input end of the cyclic wavelength demultiplexer/multiplexer, and an output end of the cyclic wavelength demultiplexer/multiplexer is connected to an input end of the reflector. The method includes:

outputting, by the multi-longitudinal mode lasers, multi-longitudinal mode signals having a periodically repeated frequency interval to the cyclic wavelength demultiplexer/multiplexer, where the period is Δfmode;

performing, by the cyclic wavelength demultiplexer/multiplexer, periodically repeated filtering on the input multi-longitudinal mode signals by using filter windows of input ends, to obtain single frequency signals corresponding to the filter windows of the input ends of the cyclic wavelength demultiplexer/multiplexer, where a repetition period of the filter window is Δfband, Δfmode is different from Δfband, and Δfmode and Δfband are not in an integer-multiple relationship;

multiplexing, by the cyclic wavelength demultiplexer/multiplexer, the filtered single frequency signals from the input ends, and outputting multiplexed signal to the reflector by using the output end of the cyclic wavelength demultiplexer/multiplexer;

reflecting, by the reflector, a multiplexed signal of a preset portion of power in the received multiplexed signal back to the cyclic wavelength demultiplexer/multiplexer, and outputting a remaining signal other than the preset portion of power in the received multiplexed signal from the output end of the reflector;

demultiplexing, by the cyclic wavelength demultiplexer/multiplexer, multiplexed signal reflected by the reflector to single frequency signals, and separately determining filter windows of target input ends that correspond to the demultiplexed single frequency signals and the target input ends of the cyclic wavelength demultiplexer/multiplexer that correspond to the filter windows of the target input ends;

separately feeding back, by the cyclic wavelength demultiplexer/multiplexer by using the target input ends, the demultiplexed single frequency signals to the multi-longitudinal mode lasers connected to the target input ends;

locking on, by the multi-longitudinal mode lasers, wavelengths of the single frequency signals fed back by the cyclic wavelength demultiplexer/multiplexer, and generating and outputting signals whose wavelengths are the same as the wavelengths of the single frequency signals fed back by the cyclic wavelength demultiplexer/multiplexer;

when an output signal of the multi-longitudinal mode laser needs to be tuned to a signal of a target wavelength, determining a current wavelength of the output signal;

calculating a difference a between a wavelength of a current output signal of the multi-longitudinal mode laser and the target wavelength and a difference b between $\Delta fmode$ and $\Delta fband$; and adjusting the wavelength of the output signal of the multi-longitudinal mode laser toward the target wavelength, where an adjustment amplitude is $a/\Delta fmode-1+b$.

According to a fourth aspect, an embodiment of the present invention provides a wavelength tunable method, applied to an optical transmitter apparatus. The optical transmitter apparatus includes a plurality of multi-longitudinal mode lasers, an optical splitter disposed on an output end of each of the multi-longitudinal mode lasers, a cyclic wavelength demultiplexer/multiplexer, and a reflector. The optical splitter splits a signal output by the multi-longitudinal mode laser into two parts, one part is connected to one input end of the cyclic wavelength demultiplexer/multiplexer, the other part of the signal output by the multi-longitudinal mode laser is output, and an output end of the cyclic wavelength demultiplexer/multiplexer is connected to an input end of the reflector. The method includes:

outputting, by the multi-longitudinal mode lasers, multi-longitudinal mode signals having a periodically repeated frequency interval to the cyclic wavelength demultiplexer/multiplexer, where the period is $\Delta fmode$;

performing, by the cyclic wavelength demultiplexer/multiplexer by using filter windows of input ends, periodically repeated filtering on multi-longitudinal mode signals input by the optical splitter, to obtain single frequency signals corresponding to the filter windows of the input ends of the cyclic wavelength demultiplexer/multiplexer, where a repetition period of the filter window is $\Delta fband$, $\Delta fmode$ is different from $\Delta fband$, and $\Delta fmode$ and $\Delta fband$ are not in an integer-multiple relationship;

multiplexing, by the cyclic wavelength demultiplexer/multiplexer, the filtered single frequency signals from the input ends, and outputting multiplexed signal to the reflector by using the output end of the cyclic wavelength demultiplexer/multiplexer;

reflecting, by the reflector, the input multiplexed signal back to the cyclic wavelength demultiplexer/multiplexer;

demultiplexing, by the cyclic wavelength demultiplexer/multiplexer, the multiplexed signal reflected by the reflector to single frequency signals, and separately determining filter windows of target input ends that correspond to the demultiplexed single frequency signals and the target input ends of the cyclic wavelength demultiplexer/multiplexer that correspond to the filter windows of the target input ends;

separately feeding back, by the cyclic wavelength demultiplexer/multiplexer by using the target input ends, the demultiplexed single frequency signals to the multi-longitudinal mode lasers connected to the target input ends;

locking on, by the multi-longitudinal mode lasers, wavelengths of the single frequency signals fed back by the cyclic wavelength demultiplexer/multiplexer, and generating and outputting signals whose wavelengths are the same as the wavelengths of the single frequency signals fed back by the cyclic wavelength demultiplexer/multiplexer;

when an output signal of the multi-longitudinal mode laser needs to be tuned to a signal of a target wavelength, calculating a difference a between a wavelength of a current output signal of the multi-longitudinal mode laser and the target wavelength and a difference b between $\Delta fmode$ and $\Delta fband$; and adjusting the wavelength of the output signal of the multi-longitudinal mode laser toward the target wavelength, where an adjustment amplitude is $a/\Delta fmode-1+b$.

The embodiments of the present invention provide a wavelength tunable optical transmitter apparatus. In the embodiments of the present invention, a plurality of multi-longitudinal mode lasers, a cyclic wavelength demultiplexer/multiplexer, and a reflector form the optical transmitter apparatus. First, the cyclic wavelength demultiplexer/multiplexer performs filtering on multi-longitudinal mode signals output by the multi-longitudinal mode lasers, to obtain multiplexed signal of a wavelength required by the optical transmitter apparatus. Then, the reflector reflects a multiplexed signal of some power back to the cyclic wavelength demultiplexer/multiplexer. The cyclic wavelength demultiplexer/multiplexer demultiplexes the multiplexed signal and then, feeds back the demultiplexed multiplexed signal to the multi-longitudinal mode lasers, so that the multi-longitudinal mode laser determines a wavelength of an output signal according to a wavelength of the fed back signal. Therefore, the multi-longitudinal mode lasers continually output signals of the determined wavelength, that is, the optical transmitter apparatus can continually output multiplexed signal of a required wavelength. Filter windows of input ends of the cyclic wavelength demultiplexer/multiplexer are set to be periodically repeated, and a frequency interval period of the multi-longitudinal mode signals output by the multi-longitudinal mode lasers and a petition period of the filter windows of the input ends of the cyclic wavelength demultiplexer/multiplexer are different and are not in an integer-multiple relationship, so that when the multi-longitudinal mode lasers output the multi-longitudinal mode signals, only one signal can pass through the filter window of the cyclic wavelength demultiplexer/multiplexer at one moment. Therefore, a simple signal corresponding to the filter window of the input end is obtained. When a wavelength of the signal needs to be tuned, only a spectrum of the output signal of the multi-longitudinal mode laser needs to be translated, so that another signal output by the multi-longitudinal mode laser corresponds to another filter window of the cyclic wavelength demultiplexer/multiplexer, that is, after performing filtering on the input multi-longitudinal mode signals, the cyclic wavelength demultiplexer/multiplexer obtains a simple signal corresponding to the filter window of the input end at the moment. Because center wavelengths of the filter windows of the input ends of two times of filtering are different, wavelengths of the single frequency signals obtained by means of the two times of filtering are also different, that is, the wavelength of the output signal is tuned. In the embodiments of the present invention, a structure of the multi-longitudinal mode laser and a structure of the cyclic wavelength demultiplexer/multiplexer are simple, and during manufacturing processes, no fine manufacturing process or complex algorithm is required, so that design and manufacturing processes of the laser are simplified, thereby reducing costs of the optical transmitter apparatus.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

To make advantages of the technical solutions in the present invention more clear, the following describes the present invention in detail with reference to the accompanying drawings and embodiments.

Figure 1:
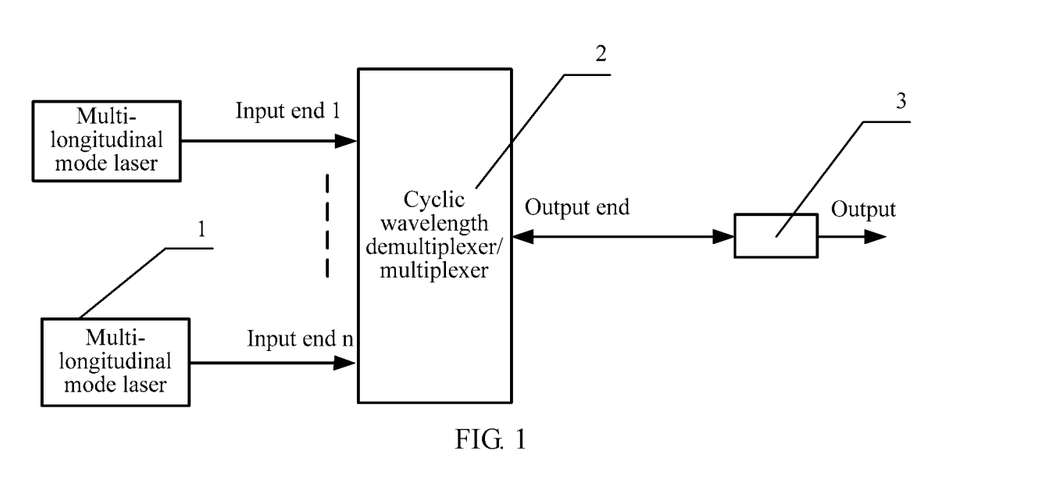
FIG. 1 is a schematic structural diagram of a wavelength tunable optical transmitter apparatus according to an embodiment of the present invention.

An embodiment of the present invention provides a wavelength tunable optical transmitter apparatus. As shown in FIG. 1, the apparatus includes a plurality of multi-longitudinal mode lasers 1, a cyclic wavelength demultiplexer/multiplexer 2, and a reflector 3, an output end of the multi-longitudinal mode laser 1 is connected to one input end of the cyclic wavelength demultiplexer/multiplexer 2, an output end of the cyclic wavelength demultiplexer/multiplexer 2 is connected to an input end of the reflector 3, and an output end of the reflector 3 outputs a multiplexed signal. The multi-longitudinal mode lasers 1 output multi-longitudinal mode signals having a periodically repeated frequency interval, where the period is $\Delta f_{mode}$. The cyclic wavelength demultiplexer/multiplexer 2 performs periodically repeated filtering on the input multi-longitudinal mode signals by using filter windows of input ends, to obtain single frequency signals corresponding to the filter windows of the input ends of the cyclic wavelength demultiplexer/multiplexer 2; and the cyclic wavelength demultiplexer/multiplexer 2 multiplexes filtered single frequency signals from the input ends and outputs multiplexed signal to the reflector 3 by using the output end of the cyclic wavelength demultiplexer/multiplexer 2, where a repetition period of the filter window is $\Delta f_{band}$, $\Delta f_{mode}$ is different from $\Delta f_{band}$, and $\Delta f_{mode}$ and $\Delta f_{band}$ are not in an integer-multiple relationship. The reflector 3 reflects a multiplexed signal of a preset portion of power in the input multiplexed signal back to the cyclic wavelength demultiplexer/multiplexer 2, and outputs a remaining signal other than the preset portion of power in the input multiplexed signal from the output end of the reflector 3. After receiving the multiplexed signal reflected by the reflector, the cyclic wavelength demultiplexer/multiplexer 2 demultiplexes the multiplexed signal reflected by the reflector 3 to single frequency signals, separately determines filter windows of target input ends that correspond to the demultiplexed single frequency signals and the target input ends of the cyclic wavelength demultiplexer/multiplexer 2 that correspond to the filter windows of the target input ends, and feeds back, by using the target input ends, the demultiplexed single frequency signals to the multi-longitudinal mode lasers 1 connected to the target input ends. The multi-longitudinal mode lasers 1 lock on wavelengths of the single frequency signals fed back by the cyclic wavelength demultiplexer/multiplexer 2, and generate and output signals whose wavelengths are the same as the wavelengths of the single frequency signals fed back by the cyclic wavelength demultiplexer/multiplexer 2.

Specifically, an implementation of the multi-longitudinal mode laser 1 may be a semiconductor laser based on a Fabry-Perot resonant cavity or a ring resonant cavity. n multi-longitudinal mode lasers 1 are respectively connected to n input ends of the cyclic wavelength demultiplexer/multiplexer 2. The reflector 3 may be a transflective 90-degree Faraday rotation mirror (FRM). The FRM performs 90° polarization rotation on multiplexed signal input to the FRM, and reflects multiplexed signal of some power, to respectively feed back the multiplexed signal of the preset portion of power to the multi-longitudinal mode lasers 1 along original paths, and transmit remaining multiplexed signal.

Figure 2:
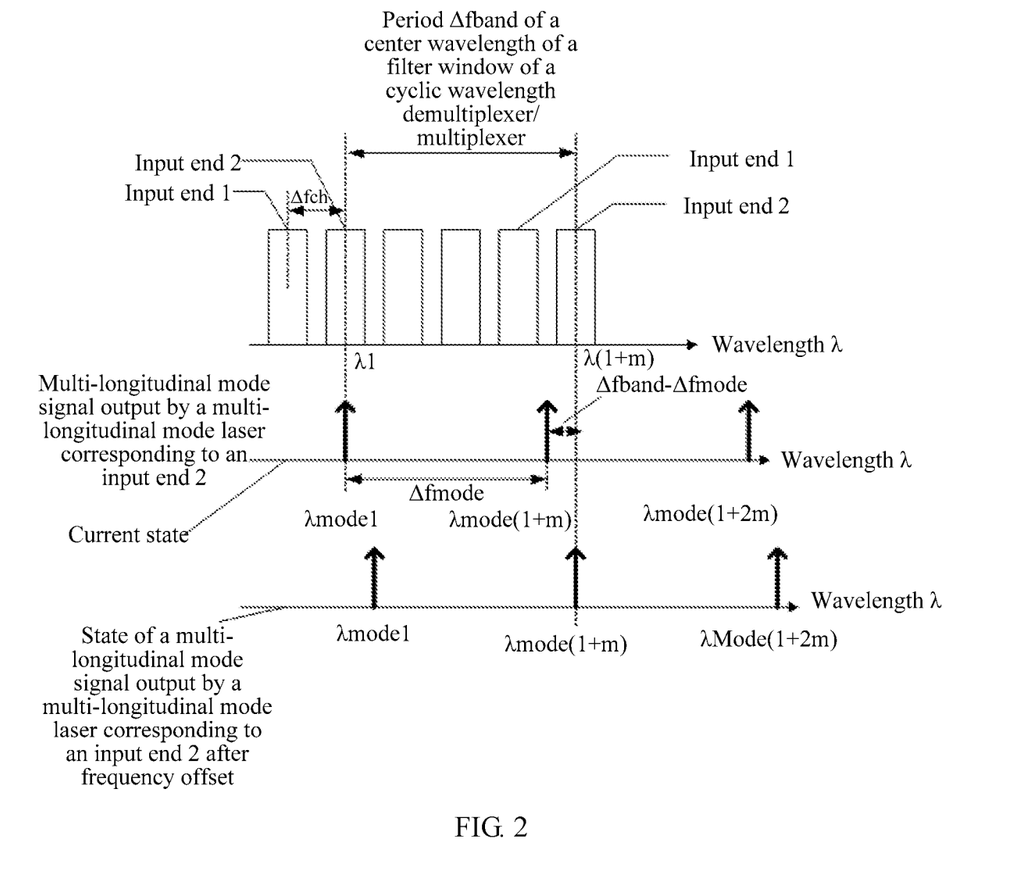
FIG. 2 is a schematic diagram of wavelength tuning of a wavelength tunable optical transmitter apparatus according to an embodiment of the present invention.

It should be noted that the multi-longitudinal mode lasers output multi-longitudinal mode signals at the beginning, the cyclic wavelength demultiplexer/multiplexer 2 performs filtering on the multi-longitudinal mode signals output by the multi-longitudinal mode lasers 1, to obtain single frequency signals, and then, multiplexes the single frequency signals and outputs multiplexed signal to a port of one optical fiber. The reflector 3 is connected to an output port of the cyclic wavelength demultiplexer/multiplexer 2, and separately feeds back, to the multi-longitudinal mode lasers 1, single frequency signals obtained after demultiplexing multiplexed signal of some power by the cyclic wavelength demultiplexer/multiplexer 2. The multi-longitudinal mode lasers 1 lock on the wavelengths of the single frequency signals fed back by the cyclic wavelength demultiplexer/multiplexer 2, generate single frequency signals whose wavelengths are the same as the wavelengths of the locked-on single frequency signals in a subsequent process, and output the generated single frequency signals to an input end of the cyclic wavelength demultiplexer/multiplexer 2. Therefore, the multi-longitudinal mode lasers 1, the filter windows of the cyclic wavelength demultiplexer/multiplexer 2, and the reflector 3 form a self-injection feedback apparatus, so that the multi-longitudinal mode laser 1 is locked on a single longitudinal mode output mode, thereby ensuring that the multi-longitudinal mode laser 1 outputs a simple signal of a wavelength at a moment. A frequency offset exists between the repetition period $\Delta$fmode of the output signals of the multi-longitudinal mode lasers 1 and the repetition period $\Delta$fband of a center wavelength of the filter window of each input end of the cyclic wavelength demultiplexer/multiplexer 2. That is, $\Delta$fmode is different from $\Delta$fband, and $\Delta$fmode and $\Delta$fband are not in an integer-multiple relationship. Therefore, $\Delta$fmode and $\Delta$fband form a Vernier effect. An equivalent free spectral range (FSR) of the Vernier effect is: FSR=$\Delta$fmode*$\Delta$fband/($\Delta$fmode−$\Delta$fband). In an FSR range, a wavelength of only one laser signal in the multi-longitudinal mode signals matches a center wavelength of the filter window of the cyclic wavelength demultiplexer/multiplexer. In this way, by means of self-injection feedback locking-on, only resonance of a longitudinal mode in which the wavelength matches the center wavelength of the filter window of the cyclic wavelength demultiplexer/multiplexer is allowed, and other longitudinal modes in which a wavelength does not match the center wavelength of the filter window of the cyclic wavelength demultiplexer/multiplexer are all suppressed, so that output of the multi-longitudinal mode laser is locked on a single frequency output mode, and the wavelength of the output simple signal is aligned with the center wavelength of the filter window of the cyclic wavelength demultiplexer/multiplexer 2. If the window of the cyclic wavelength demultiplexer/multiplexer 2 is aligned with an International Telecommunication Union Standardization grid (International Telecommunication Union standardization grid, ITU-T grid), the wavelength of the simple signal locked on by means of filtering by the cyclic wavelength demultiplexer/multiplexer 2 is correspondingly aligned with the ITU-grid. Therefore, the optical transmitter apparatus in this embodiment of the present invention does not need additional wavelength current diagram commissioning, thereby reducing costs and use complexity. In addition, the wavelength locked on by the multi-longitudinal mode laser 1 is tuned to a filter window of a next period of the cyclic wavelength demultiplexer/multiplexer 2 by shifting a frequency of the output signal of the multi-longitudinal mode laser 1. A frequency shift value is equal to a difference between $\Delta$fmode and $\Delta$fband. For example, as shown in FIG. 2, the cyclic wavelength demultiplexer/multiplexer 2 includes four input ports, and an interval between the input ports is fch. Multi-longitudinal mode lasers 1 corresponding to the input ends 2 output a plurality of longitudinal modes of wavelengths $\lambda$mode1, $\lambda$mode(1+m), and $\lambda$mode(1+2m). In a current state, if a signal of the wavelength $\lambda$mode1 in the multi-longitudinal mode signals matches a center wavelength $\lambda$1 of the filter window of the input end 2 of the cyclic wavelength demultiplexer/multiplexer 2, the multi-longitudinal mode laser 1 locks on a signal of a wavelength $\lambda$1 by means of self-injection feedback. When a signal whose wavelength is $\lambda$(1+m) needs to be locked on, the multi-longitudinal mode laser 1 is adjusted to shift the frequency toward a high frequency by a frequency shift value of $\Delta$fband−$\Delta$fmode, frequency shifting is performed on the longitudinal mode signal whose wavelength is $\lambda$mode(1+m) to make the wavelength of the longitudinal mode signal match a center wavelength $\lambda$(1+m) of the filter window of the input end 2 of the cyclic wavelength demultiplexer/multiplexer 2. Therefore, the multi-longitudinal mode laser 1 locks on the signal of the wavelength $\lambda$(1+m) by means of self-injection feedback, thereby tuning the wavelength.

It should be noted that in the wavelength tunable optical transmitter apparatus in this embodiment of the present invention, the plurality of the multi-longitudinal mode lasers 1 are the same, so that a manufacturing process of the optical transmitter apparatus is further simplified, and costs are reduced.

In this embodiment of the present invention, it is set that the filter window of the input end of the cyclic wavelength demultiplexer/multiplexer 2 is periodically repeated, and the frequency interval period of the multi-longitudinal mode signals output by the multi-longitudinal mode lasers 1 and the repetition period of the filter window of the input end of the cyclic wavelength demultiplexer/multiplexer 2 are different and are not in an integer-multiple relationship, so that when the multi-longitudinal mode lasers 1 output the multi-longitudinal mode signals, only one signal can pass through the filter window of the cyclic wavelength demultiplexer/multiplexer 2 at one moment, and a simple signal corresponding to the filter window of the input end is obtained. When a wavelength of the signal needs to be tuned, only a spectrum of the output signal of the multi-longitudinal mode laser 1 needs to be translated, so that another signal output by the multi-longitudinal mode laser 1 corresponds to another filter window of the cyclic wavelength demultiplexer/multiplexer 2. That is, after performing filtering on the input multi-longitudinal mode signals, the cyclic wavelength demultiplexer/multiplexer 2 obtains a simple signal corresponding to the filter window of the input end at the moment. Because center wavelengths of the filter windows of the input ends of the two times of filtering are different, wavelengths of the single frequency signals obtained by means of the two times of filtering are also different. That is, the wavelength of the output signal is tuned. In this embodiment of the present invention, a structure of the multi-longitudinal mode laser 1 and a structure of the cyclic wavelength demultiplexer/multiplexer 2 are simple, and during manufacturing processes, no fine manufacturing process or complex algorithm is required, so that design and manufacturing processes of the laser are simplified, thereby reducing costs of the optical transmitter apparatus.

It should be noted that compared with a conventional WDM light source based on a laser such as a DFB/DBR, this embodiment of the present invention, a WDM light source is formed by a semiconductor multi-longitudinal mode laser based on a Fabry-Perot resonant cavity or a ring resonant cavity having a simple structure, and designs of lasers connected to all ends of the cyclic wavelength demultiplexer/multiplexer 2 are the same, so that designing and manufacturing of the laser are simplified, thereby reducing overall costs of a system. In addition, this embodiment of the present invention is based on self-injection feedback. The multi-longitudinal mode laser locks on and outputs the simple signal by means of self-injection, and the wavelength of the simple signal automatically aligns with the filter window of the cyclic wavelength demultiplexer/multiplexer 2 without additional commissioning, thereby reducing test costs of the optical transmitter apparatus.

Figure 3:
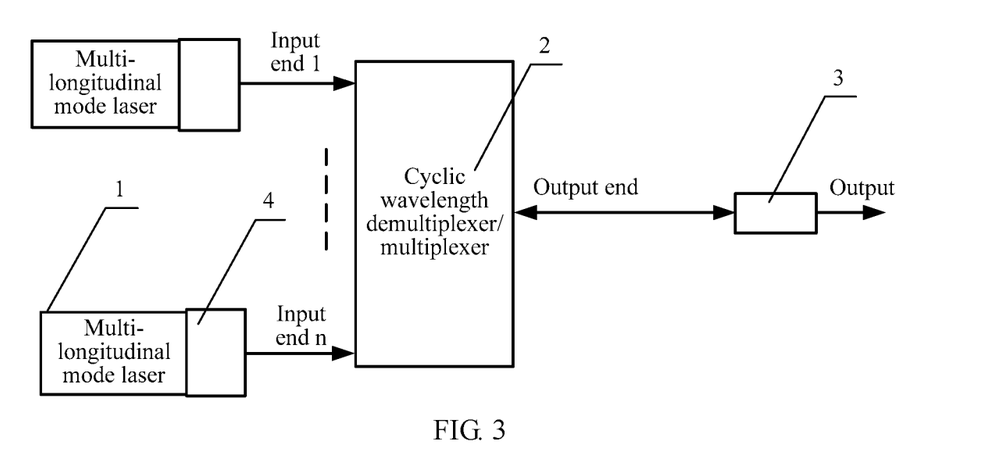
FIG. 3 is a schematic structural diagram of a wavelength tunable optical transmitter apparatus according to an embodiment of the present invention.

In an implementation of this embodiment of the present invention, as shown in FIG. 3, the output end of the multi-longitudinal mode laser 1 is connected to a 45-degree Faraday rotator 4, and an output end of the Faraday rotator 4 is connected to the input end of the cyclic wavelength demultiplexer/multiplexer 2, so that the 45-degree Faraday rotator 4 can recover a polarization state of the signal fed back by the cyclic wavelength demultiplexer/multiplexer 2 to a state of the signal when the signal is output by the multi-longitudinal mode laser 1.

Figure 4:
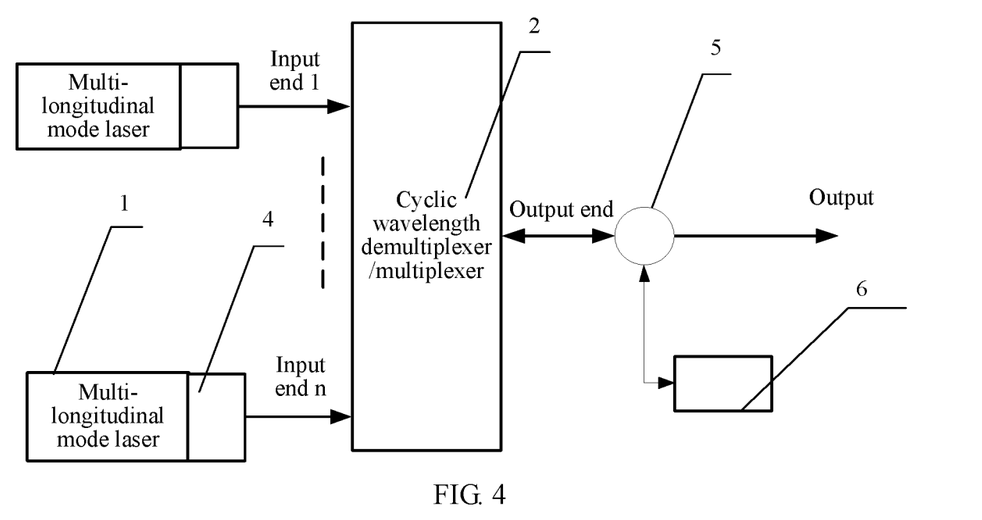
FIG. 4 is a schematic structural diagram of a wavelength tunable optical transmitter apparatus according to an embodiment of the present invention.

In an implementation of this embodiment of the present invention, as shown in FIG. 4, the reflector 3 includes an optical splitter 5. The optical splitter 5 splits the multiplexed signal output by the cyclic wavelength demultiplexer/multiplexer 2 into two parts. One part is connected to an input end of a total reflection 90-degree Faraday rotation mirror 6. The reflector is a total reflection Faraday rotation mirror. The other part of the multiplexed signal is output.

In this way, the optical splitter 5 splits the multiplexed signal output by the cyclic wavelength demultiplexer/multiplexer 2 into two parts, one part that is connected to the input end of the total reflection 90-degree Faraday rotator 6 is used for signal feedback, and the other path of the multiplexed signal is output. This has a function the same as a function of the transflective 90-degree Faraday rotator.

Figure 5:
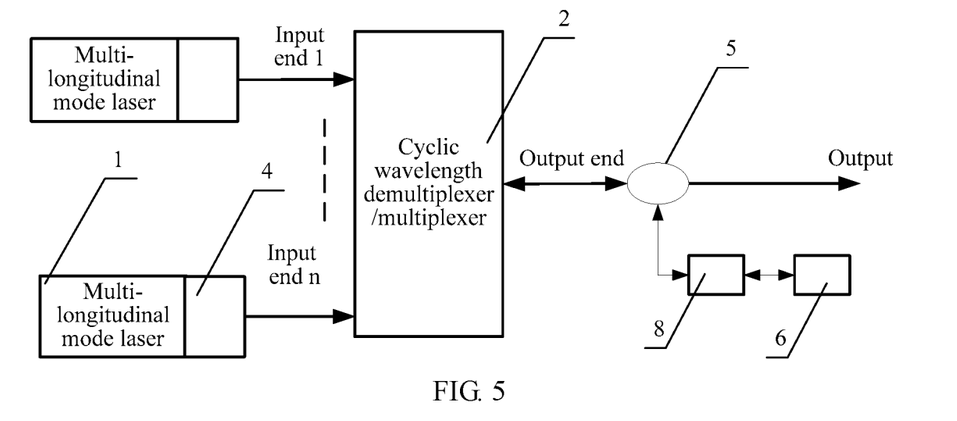
FIG. 5 is a schematic structural diagram of a wavelength tunable optical transmitter apparatus according to an embodiment of the present invention.

In an implementation of this embodiment of the present invention, as shown in FIG. 5, an Etalon 8 is disposed between the optical splitter and the total reflection 90-degree Faraday rotation mirror.

Figure 6:
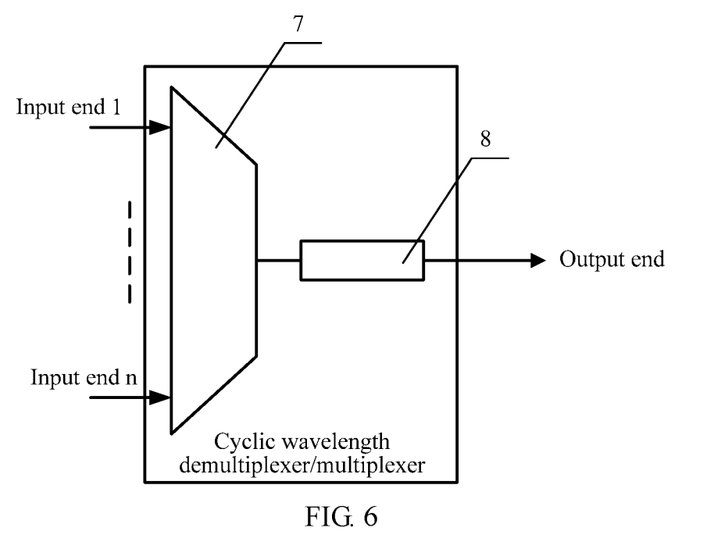
FIG. 6 is a schematic structural diagram of a wavelength tunable optical transmitter apparatus according to an embodiment of the present invention.

In an implementation of this embodiment of the present invention, as shown in FIG. 6, the cyclic wavelength demultiplexer/multiplexer 2 includes a cyclic arrayed waveguide grating 7 and an Etalon 8, an input end of the cyclic arrayed waveguide grating 7 is connected to the output end of the Faraday rotator 4, an output end of the cyclic arrayed waveguide grating 7 is connected to an input end of the etalon 8, and an output end of the etalon 8 is connected to the input end of the reflector 3. The etalon 8 is aligned with a filter window of the cyclic arrayed waveguide grating 7, thereby controlling wavelength locking-on precision by means of the self-injection feedback by the multi-longitudinal mode laser.

The cyclic wavelength demultiplexer/multiplexer 2 includes the cyclic arrayed waveguide grating 7 (Cyclic AWG) having n input ports, and the etalon 8 connected to an output port of the cyclic arrayed waveguide grating 7. The cyclic arrayed waveguide grating 7 may be of a common Gaussian type or a flat-top type. Each input end is a periodic filter window. The etalon 8 is aligned with a filter window of the cyclic arrayed waveguide grating 7, thereby controlling wavelength locking-on precision by means of the self-injection feedback by the multi-longitudinal mode laser.

Figure 7:
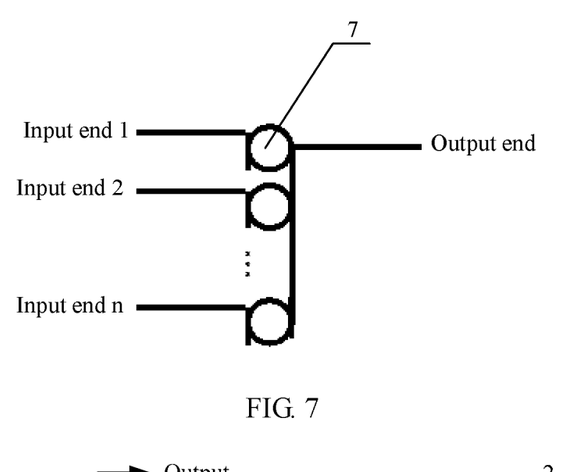
FIG. 7 is a schematic structural diagram of a wavelength tunable optical transmitter apparatus according to an embodiment of the present invention.

In an implementation of this embodiment of the present invention, as shown in FIG. 7, the cyclic wavelength demultiplexer/multiplexer 2 includes N microring resonant cavities 9 that are connected in series, each of the microring resonant cavities 9 corresponds to one input end of the cyclic wavelength demultiplexer/multiplexer 2, output ends of the N microring resonant cavities are connected in series, to form the output end of the cyclic wavelength demultiplexer/multiplexer 2. Each of the microring resonant cavities 9 includes a filter window whose repetition period is $\Delta fband$, and there is an interval $\Delta fch$ between filter windows of two neighboring microring resonant cavities 9, where $\Delta fband = N*\Delta fch$, and N is equal to a quantity of the input ends of the cyclic wavelength demultiplexer/multiplexer 2.

Each of the microring resonant cavities 9 corresponds to an input port, and includes a periodic filter window. The filter windows all have a same free spectral range FSR. The FSR of the filter window corresponds to $\Delta fband$ of the cyclic wavelength demultiplexer/multiplexer 2.

Resonant peaks of filter windows of the microring resonant cavities 9 are staggered at equal intervals. An interval of filter windows of two neighboring microring resonant cavities is a channel interval $\Delta fch$ of the cyclic wavelength demultiplexer/multiplexer 2. A filter bandwidth of the microring resonant cavity is used to control wavelength locking-on precision by means of the self-injection feedback by the multi-longitudinal mode laser as stated above.

Figure 8:
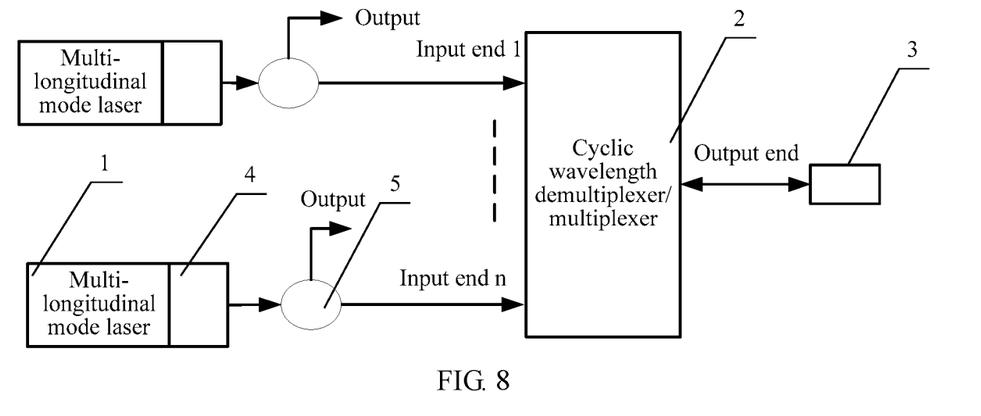
FIG. 8 is a schematic structural diagram of a wavelength tunable optical transmitter apparatus according to another embodiment of the present invention.

Another embodiment of the present invention provides a wavelength tunable optical transmitter apparatus. As shown in FIG. 8, the apparatus includes a plurality of multi-longitudinal mode lasers 1, an optical splitter 5 disposed on an output end of each of the multi-longitudinal mode lasers 1, a cyclic wavelength demultiplexer/multiplexer 2, and a reflector 3. The optical splitter 5 is disposed on the output end of each of the multi-longitudinal mode lasers 1, and the optical splitter 5 splits a signal output by the multi-longitudinal mode laser 1 into two parts. One part is connected to one input end of the cyclic wavelength demultiplexer/multiplexer 2, an output end of the cyclic wavelength demultiplexer/multiplexer 2 is connected to an input end of the reflector 3, and the other part of the signal output by the multi-longitudinal mode laser 1 is output. The multi-longitudinal mode lasers 1 output multi-longitudinal mode signals having a periodically repeated frequency interval, where the period is $\Delta fmode$. The cyclic wavelength demultiplexer/multiplexer 2 performs, by using filter windows of input ends, periodically repeated filtering on input multi-longitudinal mode signals, to obtain single frequency signals corresponding to the filter windows of the input ends of the cyclic wavelength demultiplexer/multiplexer. The cyclic wavelength demultiplexer/multiplexer 2 multiplexes the filtered single frequency signals from the input ends and outputs the multiplexed signal to the reflector by using the output end of the cyclic wavelength demultiplexer/multiplexer 2. A filter window repetition period is $\Delta fband$, $\Delta fmode$ is different from $\Delta fband$, and $\Delta fmode$ and $\Delta fband$ are not in an integer-multiple relationship. The reflector 3 reflects the input multiplexed signal to the cyclic wavelength demultiplexer/multiplexer 2. After receiving the multiplexed signal reflected by the reflector 3, the cyclic wavelength demultiplexer/multiplexer 2 demultiplexes the multiplexed signal reflected by the reflector to single frequency signals, separately determines filter windows of target input ends that correspond to the demultiplexed single frequency signals and the target input ends of the cyclic wavelength demultiplexer/multiplexer 2 that correspond to the filter windows of the target input ends, and feeds back, by using the target input ends, the demultiplexed single frequency signals to the multi-longitudinal mode lasers 1 connected to the target input ends. The multi-longitudinal mode lasers 1 lock on wavelengths of the single frequency signals fed back by the cyclic wavelength demultiplexer/multiplexer 2, and generate and output signals whose wavelengths are the same as the wavelengths of the single frequency signals fed back by the cyclic wavelength demultiplexer/multiplexer 2.

It should be noted that a 45-degree Faraday rotator is disposed between the multi-longitudinal mode laser 1 and the optical splitter, and the reflector 3 is a transflective 90-degree Faraday rotation mirror.

In an implementation of this embodiment of the present invention, the cyclic wavelength demultiplexer/multiplexer includes a cyclic arrayed waveguide grating and an etalon Etalon. An input end of the cyclic arrayed waveguide grating is connected to an output end of the Faraday rotator, an output end of the cyclic arrayed waveguide grating is connected to an input end of the etalon, and an output end of the etalon is connected to the input end of the reflector.

In another implementation of this embodiment of the present invention, the cyclic wavelength demultiplexer/multiplexer includes N microring resonant cavities that are connected in series, each of the microring resonant cavities corresponds to one input end of the cyclic wavelength demultiplexer/multiplexer, and output ends of the N microring resonant cavities are connected in series, to form the output end of the cyclic wavelength demultiplexer/multiplexer. Each of the microring resonant cavities includes a filter window whose repetition period is Δfband, and there is an interval Δfch between filter windows of two neighboring microring resonant cavities, where Δfband=N*Δfch, and N is equal to a quantity of the input ends of the cyclic wavelength demultiplexer/multiplexer.

The cyclic wavelength demultiplexer/multiplexer 2 in this embodiment of the present invention may further be implemented by using implementations in FIG. 6 and FIG. 7, and details are not described herein again.

It should be noted that in the wavelength tunable optical transmitter apparatus in this embodiment of the present invention, the plurality of the multi-longitudinal mode lasers 1 are the same, so that a manufacturing process of the optical transmitter apparatus is further simplified, and costs are reduced.

In this embodiment of the present invention, it is set that the filter window of the input end of the cyclic wavelength demultiplexer/multiplexer 2 is periodically repeated, and the frequency interval period of the multi-longitudinal mode signals output by the multi-longitudinal mode lasers 1 and the repetition period of the filter window of the input end of the cyclic wavelength demultiplexer/multiplexer 2 are different and are not in an integer-multiple relationship, so that when the multi-longitudinal mode lasers 1 output the multi-longitudinal mode signals, only one signal can pass through the filter window of the cyclic wavelength demultiplexer/multiplexer 2 at one moment, and a simple signal corresponding to the filter window of the input end is obtained. When a wavelength of the signal needs to be tuned, only a spectrum of the output signal of the multi-longitudinal mode laser 1 needs to be translated, so that another signal output by the multi-longitudinal mode laser 1 corresponds to another filter window of the cyclic wavelength demultiplexer/multiplexer 2. That is, after performing filtering on the input multi-longitudinal mode signals, the cyclic wavelength demultiplexer/multiplexer 2 obtains a simple signal corresponding to the filter window of the input end at the moment. Because center wavelengths of the filter windows of the input ends of the two times of filtering are different, wavelengths of the single frequency signals obtained by means of the two times of filtering are also different. That is, the wavelength of the output signal is tuned. In this embodiment of the present invention, a structure of the multi-longitudinal mode laser 1 and a structure of the cyclic wavelength demultiplexer/multiplexer 2 are simple, and during manufacturing processes, no fine manufacturing process or complex algorithm is required, so that design and manufacturing processes of the laser are simplified, thereby reducing costs of the optical transmitter apparatus.

Figure 9:
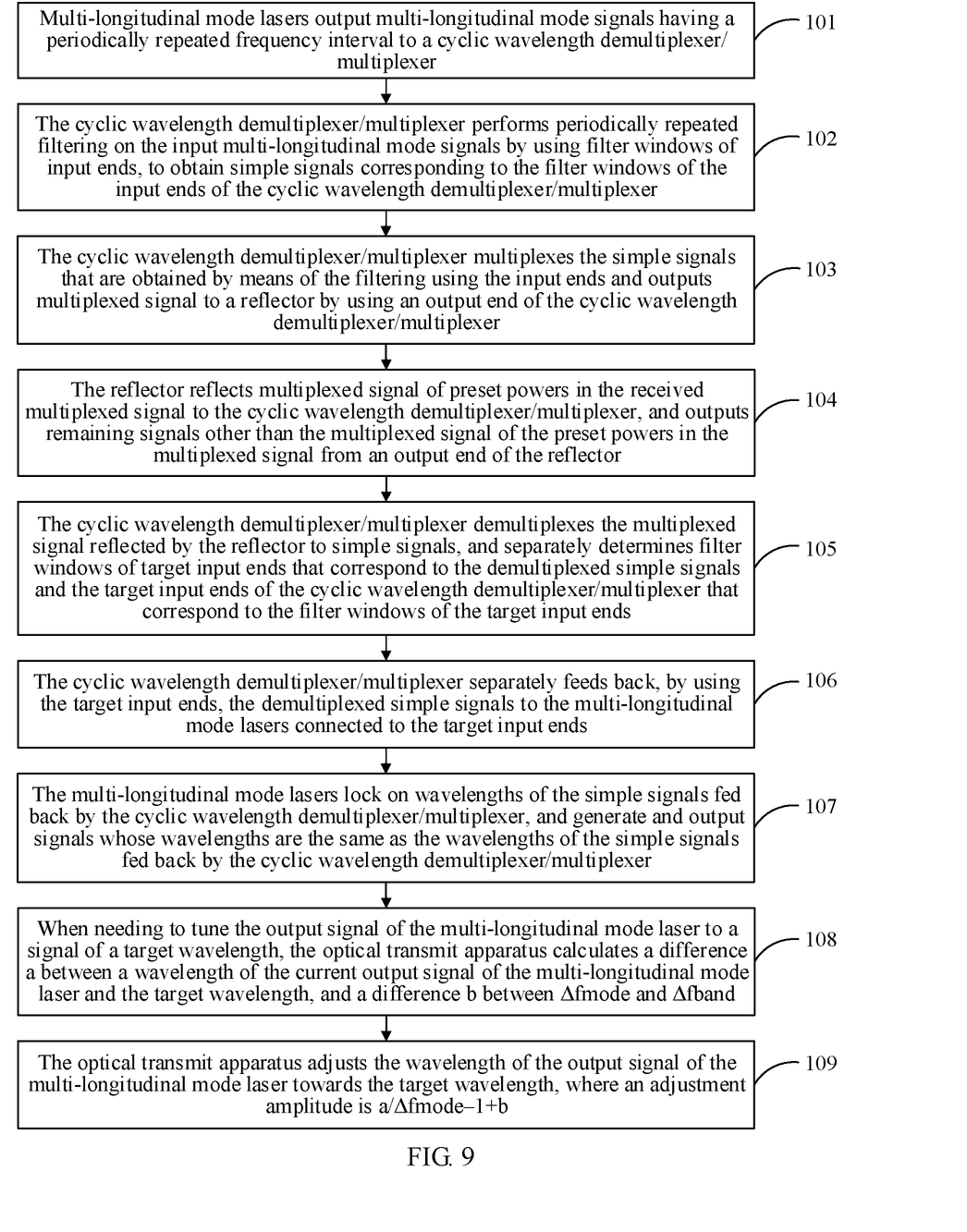
FIG. 9 is a flowchart of a wavelength tunable method according to another embodiment of the present invention.

Another embodiment of the present invention provides a wavelength tunable method, applied to an optical transmitter apparatus. The optical transmitter apparatus includes a plurality of multi-longitudinal mode lasers, a cyclic wavelength demultiplexer/multiplexer, and a reflector, an output end of each of the multi-longitudinal mode lasers is connected to one input end of the cyclic wavelength demultiplexer/multiplexer, and an output end of the cyclic wavelength demultiplexer/multiplexer is connected to an input end of the reflector. As shown in FIG. 9, the method includes the following steps.

101: The multi-longitudinal mode lasers output multi-longitudinal mode signals having a periodically repeated frequency interval to the cyclic wavelength demultiplexer/multiplexer.

The period is Δfmode, that is, a period of a frequency interval between the multi-longitudinal mode signals is Δfmode.

102: The cyclic wavelength demultiplexer/multiplexer performs periodically repeated filtering on the input multi-longitudinal mode signals by using filter windows of input ends, to obtain single frequency signals corresponding to the filter windows of the input ends of the cyclic wavelength demultiplexer/multiplexer.

A repetition period of the filter window is Δfband, that is, a repetition period of a center wavelength of the filter window is Δfband, Δfmode is different from Δfband, and Δfmode and Δfband are not in an integer-multiple relationship.

103: The cyclic wavelength demultiplexer/multiplexer multiplexes the filtered single frequency signals from the input ends and outputs multiplexed signal to the reflector by using the output end of the cyclic wavelength demultiplexer/multiplexer.

104: The reflector reflects a multiplexed signal of a preset portion of power in the received multiplexed signal back to the cyclic wavelength demultiplexer/multiplexer, and outputs a remaining signal other than the preset portion of power in the received multiplexed signal from the output end of the reflector.

105: The cyclic wavelength demultiplexer/multiplexer demultiplexes multiplexed signal reflected by the reflector to single frequency signals, and separately determines filter windows of target input ends that correspond to the demultiplexed single frequency signals and the target input ends of the cyclic wavelength demultiplexer/multiplexer that correspond to the filter windows of the target input ends.

106: The cyclic wavelength demultiplexer/multiplexer separately feeds back, by using the target input ends, the demultiplexed single frequency signals to the multi-longitudinal mode lasers connected to the target input ends.

107: The multi-longitudinal mode lasers lock on wavelengths of the single frequency signals fed back by the cyclic wavelength demultiplexer/multiplexer, and generate and output signals whose wavelengths are the same as the wavelengths of the single frequency signals fed back by the cyclic wavelength demultiplexer/multiplexer.

108: When an output signal of the multi-longitudinal mode laser needs to be tuned to a signal of a target wavelength, the optical transmitter apparatus calculates a difference a between a wavelength of a current output signal of the multi-longitudinal mode laser and the target wavelength and a difference b between Δfmode and Δfband.

109: The optical transmitter apparatus adjusts the wavelength of the output signal of the multi-longitudinal mode laser toward the target wavelength, where an adjustment amplitude is a/Δfmode−1+b.

It should be noted that the wavelength tunable method in this embodiment of the present invention is applicable to the apparatus shown in FIG. 1 to FIG. 7.

In this embodiment of the present invention, the filter window of the input end of the cyclic wavelength demultiplexer/multiplexer 2 is periodically repeated. The frequency interval period of the multi-longitudinal mode signals output by the multi-longitudinal mode laser and the repetition period of the filter window of the input end of the cyclic wavelength demultiplexer/multiplexer are different and are not in an integer-multiple relationship, so that when the multi-longitudinal mode lasers output the multi-longitudinal mode signals, only one signal can pass through the filter window of the cyclic wavelength demultiplexer/multiplexer at one moment, and a simple signal corresponding to the filter window of the input end is obtained. When the output signal of the multi-longitudinal mode laser needs to be tuned to the signal of the target wavelength, the difference a between the wavelength of the current output signal of the multi-longitudinal mode laser and the target wavelength and the difference b between Δfmode and Δfband are calculated first, and then, the wavelength of the output signal of the multi-longitudinal mode laser is adjusted toward the target wavelength, where the adjustment amplitude is a/Δfmode−1+b. In this embodiment of the present invention, the wavelength of the optical transmitter apparatus can be tuned by only translating a spectrum of the output signal of the multi-longitudinal mode laser 1. Therefore, an implementation process is simple, and no fine manufacturing process or complex algorithm is required, thereby reducing costs of the optical transmitter apparatus.

In an implementation of this embodiment of the present invention, the output ends of the multi-longitudinal mode lasers are connected to 45-degree Faraday rotators, and output ends of the Faraday rotators are connected to the input ends of the cyclic wavelength demultiplexer/multiplexer. Step 101 is specifically:

1011: The multi-longitudinal mode lasers output the multi-longitudinal mode signals to the input ends of the cyclic wavelength demultiplexer/multiplexer by using a Faraday rotator.

Figure 10:
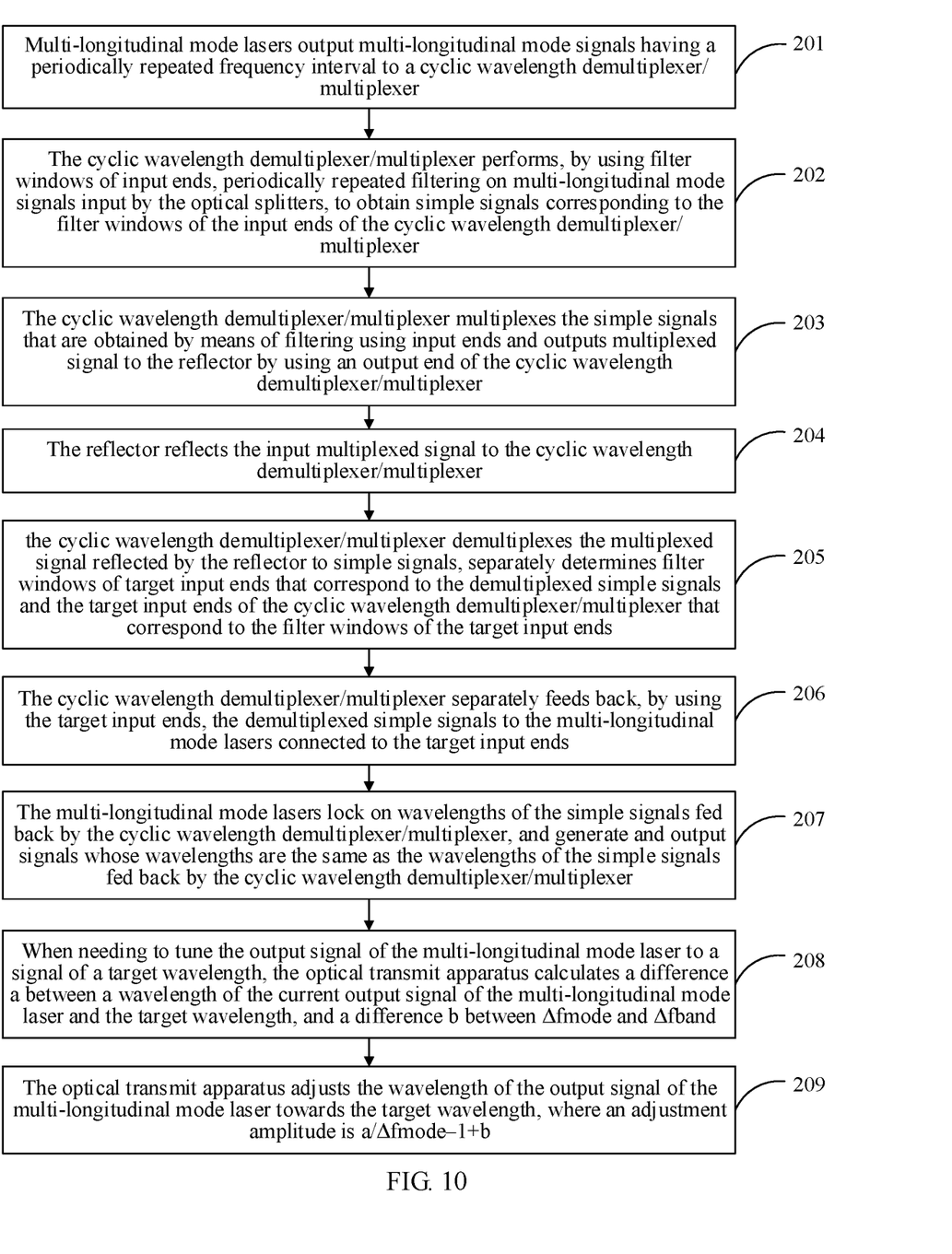
FIG. 10 is a flowchart of a wavelength tunable method according to another embodiment of the present invention.

Another embodiment of the present invention provides a wavelength tunable method, applied to an optical transmitter apparatus. The optical transmitter apparatus includes a plurality of multi-longitudinal mode lasers, an optical splitter disposed on an output end of each of the multi-longitudinal mode lasers, a cyclic wavelength demultiplexer/multiplexer, and a reflector. The optical splitter splits an signal output by the multi-longitudinal mode laser into two parts, one part is connected to one input end of the cyclic wavelength demultiplexer/multiplexer, and the other part output by the multi-longitudinal mode laser is output. An output end of the cyclic wavelength demultiplexer/multiplexer is connected to an input end of the reflector. As shown in FIG. 10, the method includes the following steps.

201: The multi-longitudinal mode lasers output multi-longitudinal mode signals having a periodically repeated frequency interval to the cyclic wavelength demultiplexer/multiplexer.

The period is Δfmode, that is, a period of a frequency interval between the multi-longitudinal mode signals is Δfmode.

202: The cyclic wavelength demultiplexer/multiplexer performs, by using filter windows of input ends, periodically repeated filtering on multi-longitudinal mode signals input by the optical splitter, to obtain single frequency signals corresponding to the filter windows of the input ends of the cyclic wavelength demultiplexer/multiplexer.

A repetition period of the filter window is Δfband, that is, a repetition period of a center wavelength of the filter window is Δfband, Δfmode is different from Δfband, and Δfmode and Δfband are not in an integer-multiple relationship.

203: The cyclic wavelength demultiplexer/multiplexer multiplexes the filtered single frequency signals from the input ends and outputs multiplexed signal to the reflector by using the output end of the cyclic wavelength demultiplexer/multiplexer.

204: The reflector reflects the input multiplexed signal back to the cyclic wavelength demultiplexer/multiplexer.

205: The cyclic wavelength demultiplexer/multiplexer demultiplexes the multiplexed signal reflected by the reflector to single frequency signals, and separately determines filter windows of target input ends that correspond to the demultiplexed single frequency signals and the target input ends of the cyclic wavelength demultiplexer/multiplexer that correspond to the filter windows of the target input ends.

206: The cyclic wavelength demultiplexer/multiplexer separately feeds back, by using the target input ends, the demultiplexed single frequency signals to the multi-longitudinal mode lasers connected to the target input ends.

207: The multi-longitudinal mode lasers lock on wavelengths of the single frequency signals fed back by the cyclic wavelength demultiplexer/multiplexer, and generate and output signals whose wavelengths are the same as the wavelengths of the single frequency signals fed back by the cyclic wavelength demultiplexer/multiplexer.

208: When an output signal of the multi-longitudinal mode laser needs to be tuned to a signal of a target wavelength, the optical transmitter apparatus calculates a difference a between a wavelength of a current output signal of the multi-longitudinal mode laser and the target wavelength and a difference b between Δfmode and Δfband.

209: The optical transmitter apparatus adjusts the wavelength of the output signal of the multi-longitudinal mode laser toward the target wavelength, where an adjustment amplitude is a/Δfmode−1+b.

In this embodiment of the present invention, the filter window of the input end of the cyclic wavelength demultiplexer/multiplexer 2 is periodically repeated. The frequency interval period of the multi-longitudinal mode signals output by the multi-longitudinal mode laser and the repetition period of the filter window of the input end of the cyclic wavelength demultiplexer/multiplexer are different and are not in an integer-multiple relationship, so that when the multi-longitudinal mode lasers output the multi-longitudinal mode signals, only one signal can pass through the filter window of the cyclic wavelength demultiplexer/multiplexer at one moment, and a simple signal corresponding to the filter window of the input end is obtained. When the output signal of the multi-longitudinal mode laser needs to be tuned to the signal of the target wavelength, the difference a between the wavelength of the current output signal of the multi-longitudinal mode laser and the target wavelength and the difference b between Δfmode and Δfband are calculated first, and then, the wavelength of the output signal of the multi-longitudinal mode laser is adjusted toward the target wavelength, where the adjustment amplitude is a/Δfmode−1+b. In this embodiment of the present invention, the wavelength of the optical transmitter apparatus can be tuned by only translating a spectrum of the output signal of the multi-longitudinal mode laser 1. Therefore, an implementation process is simple, and no fine manufacturing process or complex algorithm is required, thereby reducing costs of the optical transmitter apparatus.

It should be noted that the wavelength tunable method in this embodiment of the present invention is applicable to the apparatus corresponding to the embodiment shown in FIG. 8.

The foregoing descriptions are merely specific embodiments of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A wavelength tunable optical transmitter apparatus, comprising
a plurality of multi-longitudinal mode lasers, a cyclic wavelength demultiplexer/multiplexer, and a reflector, wherein
an output end of each of the multi-longitudinal mode lasers is connected to one input end of the cyclic wavelength demultiplexer/multiplexer, an output end of the cyclic wavelength demultiplexer/multiplexer is connected to an input end of the reflector, and an output end of the reflector outputs a multiplexed signal;
the multi-longitudinal mode lasers output multi-longitudinal mode signals having a periodically repeated frequency interval, wherein a repetition period of the multi-longitudinal mode signals is Δfmode;
the cyclic wavelength demultiplexer/multiplexer performs periodically repeated filtering on the multi-longitudinal mode signals by using filter windows of input ends, to obtain single frequency signals corresponding to the filter windows of the input ends of the cyclic wavelength demultiplexer/multiplexer; and the cyclic wavelength demultiplexer/multiplexer multiplexes the filtered single frequency signals from the input ends and outputs a multiplexed signal to the reflector by using the output end of the cyclic wavelength demultiplexer/multiplexer, wherein a repetition period of a center wavelength of the filter windows is Δfband, Δfmode is different from Δfband, and Δfmode and Δfband are not in an integer-multiple relationship;
the reflector reflects a multiplexed signal of a preset portion of power in the multiplexed signal back to the cyclic wavelength demultiplexer/multiplexer, and outputs a remaining signal other than the preset portion of power in the multiplexed signal from the output end of the reflector;
after receiving the multiplexed signal reflected by the reflector, the cyclic wavelength demultiplexer/multiplexer demultiplexes the multiplexed signal reflected by the reflector to single frequency signals, separately determines filter windows of target input ends that correspond to the demultiplexed single frequency signals and the target input ends of the cyclic wavelength demultiplexer/multiplexer that correspond to the filter windows of the target input ends; and feeds back, by using the target input ends, the demultiplexed single frequency signals to the multi-longitudinal mode lasers connected to the target input ends; and
the multi-longitudinal mode lasers lock on wavelengths of the demultiplexed single frequency signals fed back by the cyclic wavelength demultiplexer/multiplexer, and generate and output signals whose wavelengths are the same as the wavelengths of the demultiplexed single frequency signals fed back by the cyclic wavelength demultiplexer/multiplexer.

2. The optical transmitter apparatus according to claim 1, wherein the output end of each of the multi-longitudinal mode lasers is connected to a 45-degree Faraday rotator, and an output end of the Faraday rotator is connected to the one input end of the cyclic wavelength demultiplexer/multiplexer.

3. The optical transmitter apparatus according to claim 1, wherein the reflector is a transflective 90-degree Faraday rotation mirror.

4. The optical transmitter apparatus according to claim 1, wherein the reflector comprises an optical splitter and a total reflection 90-degree Faraday rotation mirror, the optical splitter splits the multiplexed signal output by the cyclic wavelength demultiplexer/multiplexer into two parts, one part is connected to an input end of the total reflection 90-degree Faraday rotation mirror, and the other part of the multiplexed signal is output.

5. The optical transmitter apparatus according to claim 4, wherein an Etalon is disposed between the optical splitter and the total reflection 90-degree Faraday rotation mirror.

6. The optical transmitter apparatus according to claim 1, wherein the cyclic wavelength demultiplexer/multiplexer comprises a cyclic arrayed waveguide grating and an Etalon, an input end of the cyclic arrayed waveguide grating is connected to an output end of a Faraday rotator, an output end of the cyclic arrayed waveguide grating is connected to an input end of the etalon, and an output end of the etalon is connected to the input end of the reflector.

7. The optical transmitter apparatus according to claim 1, wherein the cyclic wavelength demultiplexer/multiplexer comprises N microring resonant cavities that are connected in series, each of the N microring resonant cavities corresponds to one input end of the cyclic wavelength demultiplexer/multiplexer, output ends of the N microring resonant cavities are connected in series, to form the output end of the cyclic wavelength demultiplexer/multiplexer, each of the N microring resonant cavities comprises a filter window whose repetition period is Δfband, and there is an interval Δfch between filter windows of two neighboring microring resonant cavities, wherein Δfband=N*Δfch, and N is equal to a quantity of the input ends of the cyclic wavelength demultiplexer/multiplexer.

8. A wavelength tunable optical transmitter apparatus, comprising
a plurality of multi-longitudinal mode lasers, an optical splitter disposed on an output end of each of the multi-longitudinal mode lasers, a cyclic wavelength demultiplexer/multiplexer, and a reflector, wherein
the optical splitter splits a signal output by each of the multi-longitudinal mode lasers into two parts, one part of the signal is connected to an input end of the cyclic wavelength demultiplexer/multiplexer, the other part of the signal output by each of the multi-longitudinal mode lasers is output, and an output end of the cyclic wavelength demultiplexer/multiplexer is connected to an input end of the reflector;

the multi-longitudinal mode lasers output multi-longitudinal mode signals having a periodically repeated frequency interval, wherein a repetition period of the multi-longitudinal mode signals is Δfmode;

the cyclic wavelength demultiplexer/multiplexer performs, by using filter windows of input ends, periodically repeated filtering on the multi-longitudinal mode signals input by the optical splitter, to obtain single frequency signals corresponding to the filter windows of the input ends of the cyclic wavelength demultiplexer/multiplexer; and the cyclic wavelength demultiplexer/multiplexer multiplexes the filtered single frequency signals from the input ends and outputs a multiplexed signal to the reflector by using the output end of the cyclic wavelength demultiplexer/multiplexer, wherein a repetition period of a center wavelength of the filter windows is Δfband, Δfmode is different from Δfband, and Δfmode and Δfband are not in an integer-multiple relationship;

the reflector reflects the multiplexed signal back to the cyclic wavelength demultiplexer/multiplexer;

after receiving the multiplexed signal reflected by the reflector, the cyclic wavelength demultiplexer/multiplexer demultiplexes the multiplexed signal reflected by the reflector to single frequency signals, separately determines filter windows of target input ends that correspond to the demultiplexed single frequency signals and the target input ends of the cyclic wavelength demultiplexer/multiplexer that correspond to the filter windows of the target input ends; and feeds back, by using the target input ends, the demultiplexed single frequency signals to the multi-longitudinal mode lasers connected to the target input ends; and the multi-longitudinal mode lasers lock on wavelengths of the demultiplexed single frequency signals fed back by the cyclic wavelength demultiplexer/multiplexer, and generate and output signals whose wavelengths are the same as the wavelengths of the demultiplexed single frequency signals fed back by the cyclic wavelength demultiplexer/multiplexer.

9. The optical transmitter apparatus according to claim 8, wherein a 45-degree Faraday rotator is disposed between each of the multi-longitudinal mode lasers and the optical splitter, and the reflector is a total reflection 90-degree Faraday rotation mirror.

10. The optical transmitter apparatus according to claim 8, wherein the cyclic wavelength demultiplexer/multiplexer comprises a cyclic arrayed waveguide grating and an etalon, an input end of the cyclic arrayed waveguide grating is connected to an output end of a Faraday rotator, an output end of the cyclic arrayed waveguide grating is connected to an input end of the etalon, and an output end of the etalon is connected to the input end of the reflector.

11. The optical transmitter apparatus according to claim 8, wherein the cyclic wavelength demultiplexer/multiplexer comprises N microring resonant cavities that are connected in series, each of the N microring resonant cavities corresponds to one input end of the cyclic wavelength demultiplexer/multiplexer, output ends of the N microring resonant cavities are connected in series, to form the output end of the cyclic wavelength demultiplexer/multiplexer, each of the N microring resonant cavities comprises a filter window whose repetition period is Δfband, and there is an interval Δfch between filter windows of two neighboring microring resonant cavities, wherein Δfband=N*·Δfch, and N is equal to a quantity of the input ends of the cyclic wavelength demultiplexer/multiplexer.

* * * * *